United States Patent
Su et al.

(10) Patent No.: US 8,181,082 B2
(45) Date of Patent: May 15, 2012

(54) WIRELESS RECEIVER SYSTEM AND METHOD WITH AUTOMATIC GAIN CONTROL

(75) Inventors: Chi-Hsi Su, Hsinchu (TW); Wei Sheng Chang, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 670 days.

(21) Appl. No.: 12/385,110

(22) Filed: Mar. 31, 2009

(65) Prior Publication Data

US 2010/0235707 A1    Sep. 16, 2010

(30) Foreign Application Priority Data

Apr. 23, 2008 (TW) ............................ 97114898 A

(51) Int. Cl.
*H03M 13/00* (2006.01)
(52) U.S. Cl. .................................. 714/752; 455/234.1
(58) Field of Classification Search ............ 714/752; 455/234.1

See application file for complete search history.

(56) References Cited

U.S. PATENT DOCUMENTS

| | | | |
|---|---|---|---|
| 6,735,423 B1 * | 5/2004 | Uskali et al. | 455/249.1 |
| 6,901,243 B2 * | 5/2005 | Jayaraman et al. | 455/63.1 |
| 7,212,798 B1 | 5/2007 | Adams et al. | |
| 2008/0144519 A1 * | 6/2008 | Cooppan | 370/252 |

FOREIGN PATENT DOCUMENTS

| | | |
|---|---|---|
| TW | 576026 | 3/2002 |
| TW | 577197 | 4/2002 |

* cited by examiner

*Primary Examiner* — Guy Lamarre
(74) *Attorney, Agent, or Firm* — Bacon & Thomas, PLLC

(57) ABSTRACT

A wireless receiver system with automatic gain control, which includes a receiving path, an analog to digital converter, an automatic gain control (AGC) device and a controller. The controller has an adjacent channel interference off mode, an adjacent channel interference acquisition mode and an adjacent channel interference tracking mode to accordingly set the AGC device for adjusting the gains of a plurality of modules of the receiving path. Namely, the strengths of different adjacent channel interferences are appropriately adjusted to thereby obtain the best received signal quality.

20 Claims, 6 Drawing Sheets

| 64QAM CR=2/3 GI=1/4 | N-2 C/I | N+2 C/I | Sensitivity |
|---|---|---|---|
| Invention | -65dBm/-25dBm | -65dBm/-25dBm | -79.5dBm |
| Prior Art | -65dBm/-25dBm | -65dBm/-25dBm | -74dBm |
FIG. 9
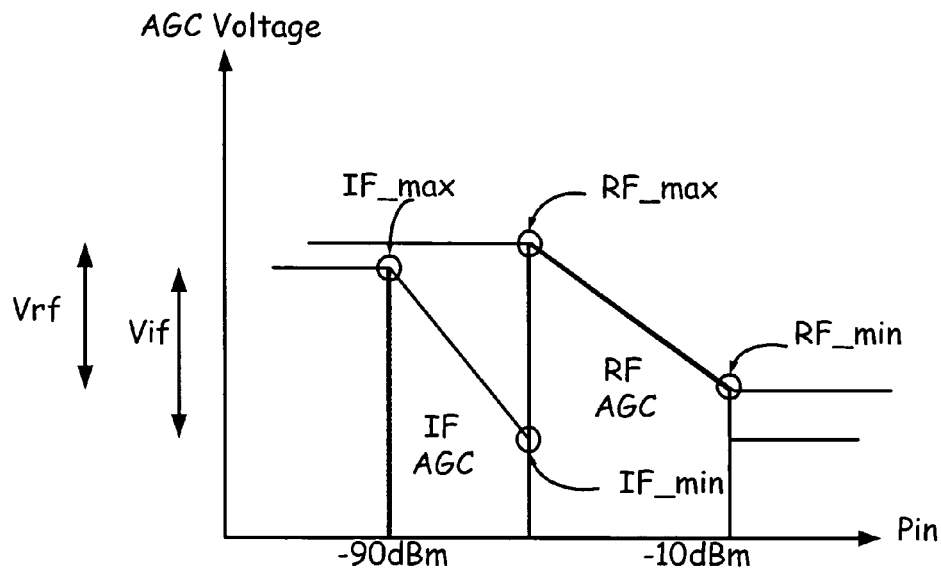
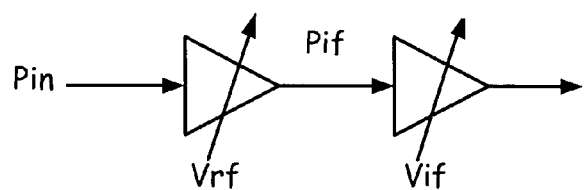
FIG. 10

WIRELESS RECEIVER SYSTEM AND METHOD WITH AUTOMATIC GAIN CONTROL

BACKGROUND OF THE INVENTION

1. Field of the Invention

The present invention relates to the technical field of wireless communication and, more particularly, to a wireless receiver system and method with automatic gain control.

2. Description of Related Art

When the radio frequency (RF) amplifier of a receiver operates in the non-linear range, the interferences such as harmonics and inter-modulation are present due to the non-linearity. FIG. 1 is a schematic diagram of a typical RF amplifier operated in the non-linear range. As shown in FIG. 1, when the RF amplifier 110 is operated in the non-linear range, the harmonics are present on the frequency multiples of an input signal. When the present harmonics fall in a range of desired channel, it causes the interference, and thus the quality of received signal in the system is reduced.

FIG. 2 is a schematic diagram of a typical RF receiver. As shown in FIG. 2, an automatic gain control (AGC) system 220 is implemented at the back of a channel filter 210 in order to measure an intermediate signal (IF) strength. Since the channel filter 210 filters out signals except in the desired channel, the desired channel signal mostly contributes to the signal strength measured by the AGC system 220.

When a received signal becomes weaker, the AGC system 220 increases the gain of the RF variable gain amplifier 230 and the gain of the IF variable gain amplifier 240. In this case, when the interference occurs at an adjacent channel, the channel filter 210 filters out the interference, and the desired channel signal mostly contributes to the signal strength measured by the AGC system 220. The input signal to the RF variable gain amplifier 230 includes the desired signal and adjacent channel interference, and in this case the harmonics present on the desired channel, as shown in FIG. 2, when the RF variable gain amplifier 230 is operated in the non-linear range due to the overlarge adjacent channel interference. Thus, the AGC system 220 of the typical receiver limits the gain of the RF variable gain amplifier 230 to thereby avoid the aforementioned problem. However, for a weaker received signal, no sufficient gain can be provided under the limit of the front-end gain, so that the received quality is negatively influenced.

To overcome this, U.S. Pat. No. 6,735,423 granted to Uskali, et al. has disclosed a "Method and apparatus for obtaining optimal performance in a receiver" by measuring the power levels for surrounding channels and a desired channel respectively to accordingly adjust the gain of the AGC device. However, an adjacent channel is necessarily set for measuring the power levels within the surrounding channels, and in this case the signal of the desired channel cannot be received. When the power of the adjacent channel interference is changed, the steps above have to be repeated again; otherwise the quality of the desired channel will be negatively influenced. Therefore, such a way is not suitable for a digital video broadcasting (DVB) system.

U.S. Pat. No. 6,901,243 granted to Jayaraman, et al. has disclosed a "Method and apparatus for mitigating adjacent channel interference in a wireless communication system", which performs an ADC sampling on a baseband and subsequently uses a digital filter to mitigate adjacent channel interference (ACI). However, such a way cannot improve the interferences such as harmonics and inter-modulation that are caused by the RF amplifier operated in a non-linear range.

U.S. Pat. No. 7,212,798 granted to Adams, et al. has disclosed an "Adaptive AGC in a wireless network receiver", which compares wideband received signal strength index (wideband RSSI) of an RF signal with the signal strength of a filtered intermediate frequency to thereby detect whether the adjacent channel interference occurs. However, the tuner of a receiver may not be implemented to provide such a wideband RSSI function. In addition, for implementing such a wideband RSSI function, the corresponding wideband RSSI module relatively adds the hardware cost.

Therefore, it is desirable to provide an improved wireless receiver system and method with automatic gain control to mitigate and/or obviate the aforementioned problems.

SUMMARY OF THE INVENTION

The object of the present invention is to provide a wireless receiver system and method with automatic gain control, with which an adaptive signal processing is employed to adjust an automatic gain controller and reduce the influence caused by the adjacent channel interferences, such that the adjacent channel interferences can be appropriately adjusted to reach to the best received signal quality.

According to a feature of the invention, a wireless receiver system with automatic gain control is provided. The system includes a receiving path, an analog to digital converter (ADC), an automatic gain control (AGC) device and a controller. The receiving path has a plurality of modules with a first module connected to an antenna system and a last module, each module having an adjustable gain. The ADC is coupled to the last module of the receiving path in order to produce a digital signal. The AGC device is coupled to the modules respectively and coupled to an output of the ADC in order to adjust a gain of the modules and produce—an AGC lock signal based on the digital signal. The controller is connected to the AGC device and has an adjacent channel interference (ACI) off mode, an adjacent channel interference (ACI) acquisition mode and an adjacent channel interference tracking mode to accordingly set the AGC device for adjusting the gain of the modules.

According to another feature of the invention, an automatic gain control (AGC) method applied in a wireless receiver system is provided. The wireless receiver system includes a receiving path and a controller. The receiving path has a plurality of modules with a first module connected to an antenna system and a last module, each module having an adjustable gain. The controller sets an AGC device in order to adjust a gain of the modules. The AGC method includes the steps of: (A) initializing the controller to enter an adjacent channel interference (ACI) off mode; (B) using the controller to determine whether an AGC lock signal produced by the AGC device is received; (C) using the controller to determine whether an uncorrected block count (UBC) produced by a forward error correction (FEC) decoder and frame synchronizer device is greater than a first threshold when the AGC lock signal is received; (D) entering the controller at an ACI acquisition mode when the UBC is greater than the first threshold, and determining whether a transmit parameter signaling (TPS) lock signal produced by a baseband processor is received; (E) entering the controller at an ACI tracking mode when the transmit parameter signaling lock signal is received, and determining whether the UBC is greater than a second threshold; and (F) using the controller to re-determine whether the UBC is greater than the first threshold when the UBC is not greater than the second threshold, and making the controller stay at the ACI tracking mode when re-determining that the UBC is not greater than the first threshold; wherein the controller at the ACI tracking mode adjusts the gain of the modules by setting a maximum gain register of the AGC based on an equation of $\text{Gain}_{k+1} = \text{Gain}_k - \mu_2$, where $\mu_2$ indicates a step size, $\text{Gain}_{k+1}$ indicates a next content of the maximum gain register to be set by the controller, and $\text{Gain}_k$ indicates a content of the maximum gain register currently set by the controller.

Other objects, advantages, and novel features of the invention will become more apparent from the following detailed description when taken in conjunction with the accompanying drawings.

BRIEF DESCRIPTION OF THE DRAWINGS

FIG. 9 is a comparison of the invention and prior art performance; and

FIG. 10 is a schematic diagram of using an AGC device to adjust gains of a receiving path according to the invention.

DETAILED DESCRIPTION OF THE PREFERRED EMBODIMENT

Figure 1:
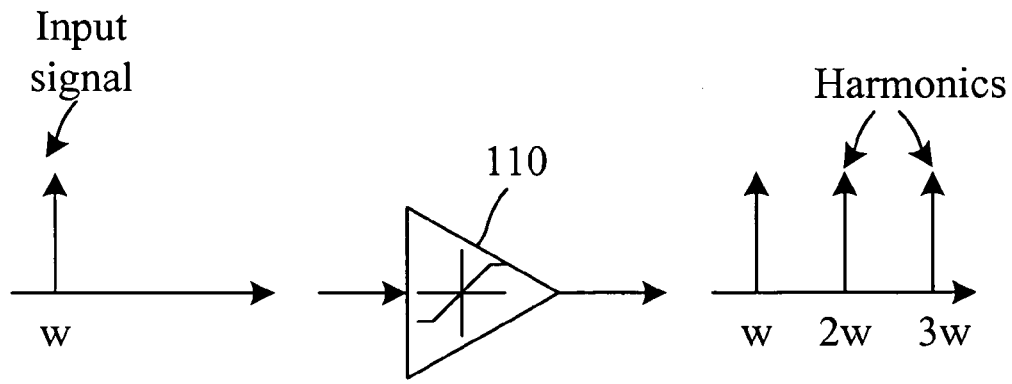
FIG. 1 is a schematic diagram of a typical RF amplifier operated in a non-linear range.
Figure 2:
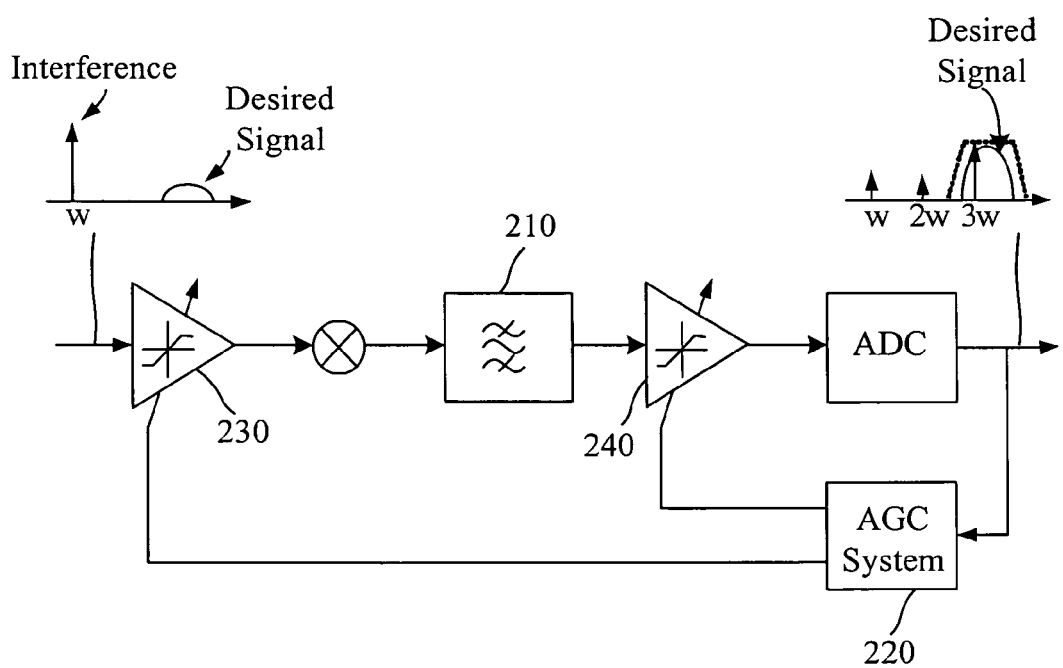
FIG. 2 is a schematic diagram of a typical RF receiver.
Figure 3:
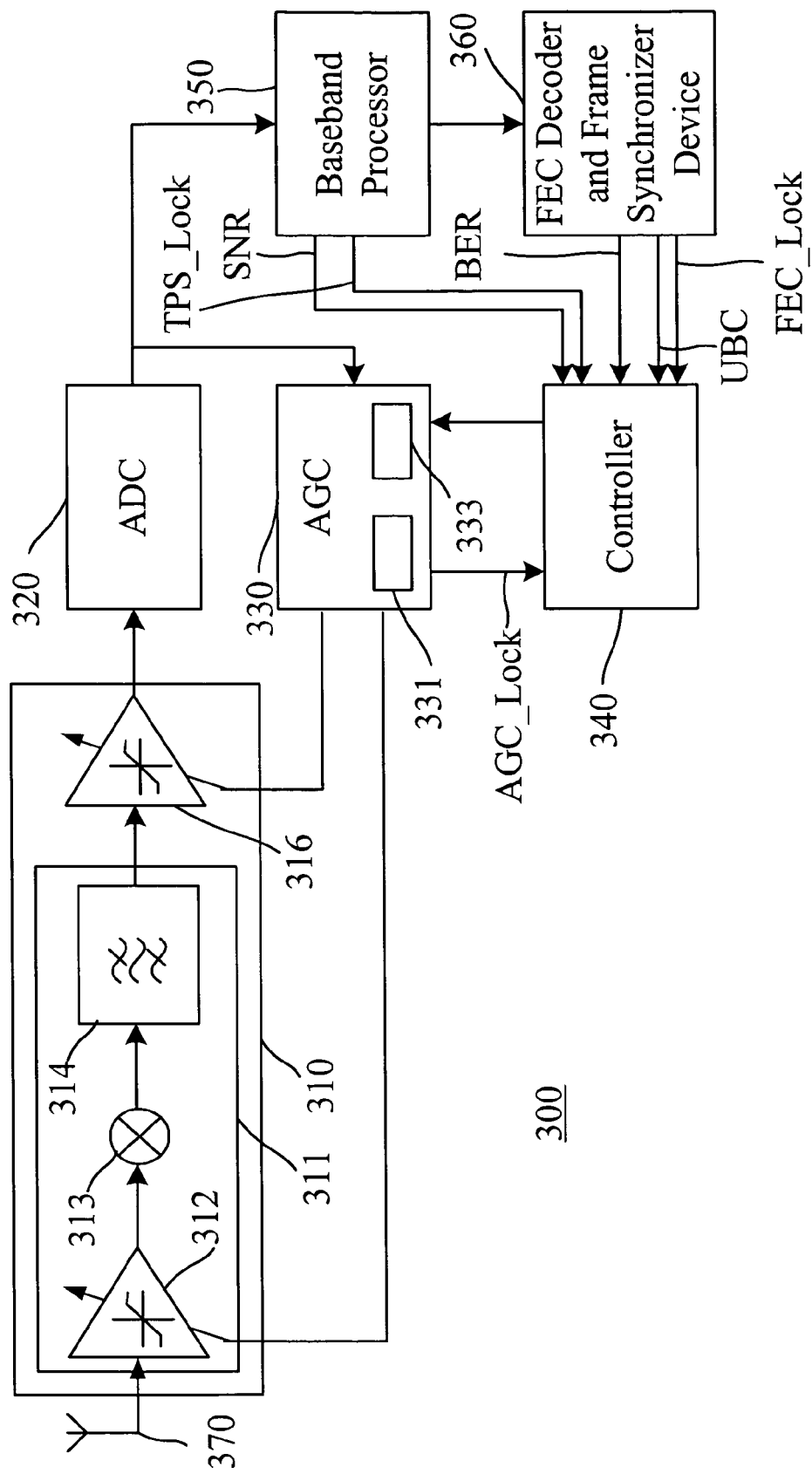
FIG. 3 is a block diagram of a wireless receiver system with automatic gain control according to the invention.

FIG. 3 is a block diagram of a wireless receiver system 300 with automatic gain control according to the invention. In FIG. 3, the system 300 includes a receiving path 310, an analog to digital converter (ADC) 320, an automatic gain control (AGC) device 330, a controller 340, a baseband processor 350 and a forward error correction (FEC) decoder and frame synchronizer device 360.

The receiving path 310 has a plurality of modules, including a first module 311 and a last module 316. Each module has an adjustable gain. The first module 311 is coupled to an antenna system 370. The first module 311 includes an RF variable gain amplifier 312, a mixer 313 and a bandpass filter 314. The first module 311 converts a radio frequency (RF) signal down to an intermediate frequency (IF) signal. The last module 316 is an IF variable gain amplifier to amplify an IF signal.

In this embodiment, the receiving path 310 functions as a down-converter to convert the RF signal to the IF signal. However, in other embodiments, the receiving path 310 can converts the RF signal to a baseband signal.

The ADC 320 is coupled to the last module 316 of the receiving path in order to sample the IF signal to thereby produce a digital signal.

The AGC device 330 is coupled to the plurality of modules 311, 316 respectively and coupled to an output of the ADC 320 in order to adjust a gain of the modules 311, 316 and produce an AGC lock signal AGC_Lock based on the digital signal.

The controller 340 is connected to the AGC device 330. The controller 340 has an adjacent channel interference (ACI) off mode ACI_Off, an adjacent channel interference acquisition mode ACI_Acquisition and an adjacent channel interference tracking mode ACI_Tracking to accordingly set the AGC device 330, respectively, for adjusting the gain of the modules 311, 316.

The baseband processor 350 is coupled to the ADC 320 and the controller 340 in order to produce a signal to noise ratio (SNR) and a transmit parameter signaling (TPS) lock signal TPS_Lock based on the digital signal. Accordingly, the controller 340 can operate the transitions of ACI_Off, ACI_Acquisition and ACI_Tracking. The baseband processor 350 produces a baseband digital signal based on the digital signal.

The FEC decoder and frame synchronizer device 360 is coupled to the baseband processor 350 and the controller 340 in order to produce a bit error rate (BER), an uncorrected block count (UBC) and a forward error correction unlock signal FEC_Unlock. Accordingly, the controller 340 can operate the transitions of ACI_Off, ACI_Acquisition and ACI_Tracking.

The AGC device 330 has a maximum gain register 331 and an upper limit register 333. The controller 340 is based on the modes ACI_Off, ACI_Acquisition and ACI_Tracking to respectively set the maximum gain register 331 of the AGC device 330 to thereby adjust the gain of the modules 311, 316.

The maximum gain register 331 temporarily stores the maximum of the gain of the modules 311, 316. The upper limit register 333 temporarily stores the upper limit of the gain of the modules 311, 316. The content of the register 331 is smaller than or equal to the content of the register 333. The registers 331 and 333 preferably contain ten bits each, with the most significant bit (MSB) to indicate the positive and negative signs. In this case, the contents of the registers 331 and 333 can represent a value from −511 to +511.

Figure 4:
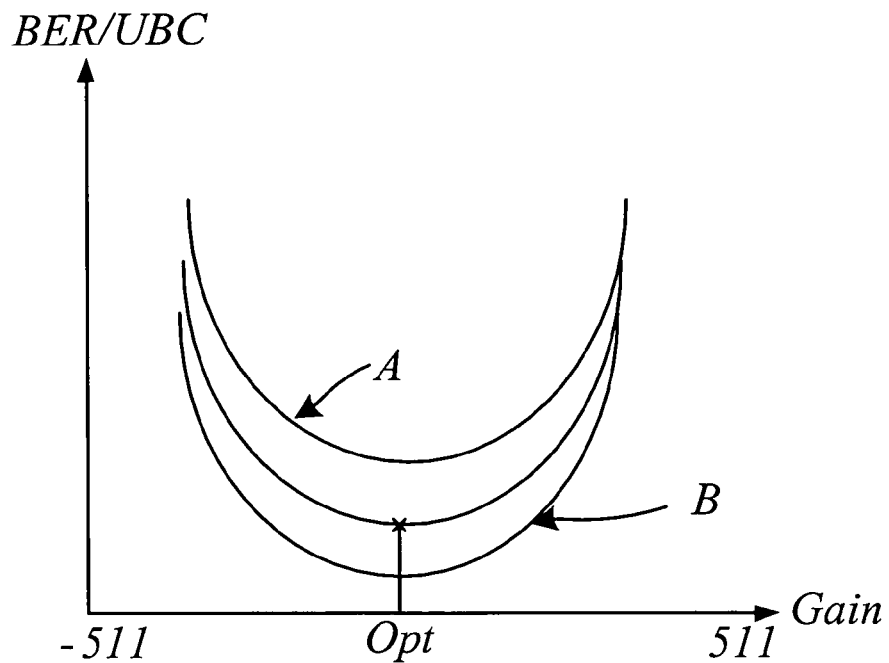
FIG. 4 is a schematic graph of a relation between the BER/UBC and the content of maximum gain register according to the invention.

FIG. 4 is a schematic graph of a relation between the BER/UBC and the content Gain of the maximum gain register 331 according to the invention, where the horizontal axis indicates the content Gain of the maximum gain register 331 and the vertical axis indicates the BER/UBC. Owing to a constant ratio of carrier to interference power level (C/I), as shown in FIG. 4, the relation is shown by the curve A when the power of a carrier increases, and the relation is shown by the curve B when the power of a carrier reduces. In addition, when the content Gain of the maximum gain register 331 reaches to a point Opt which indicates the best operating point, the lowest BER/UBC in the wireless receiver system 300 can be obtained, no matter where the power of the carrier locates.

The controller 340 at the ACI Off mode adjusts the gain of the modules 311, 316 by setting the contents of the registers 331 and 333 equal.

Figure 5:
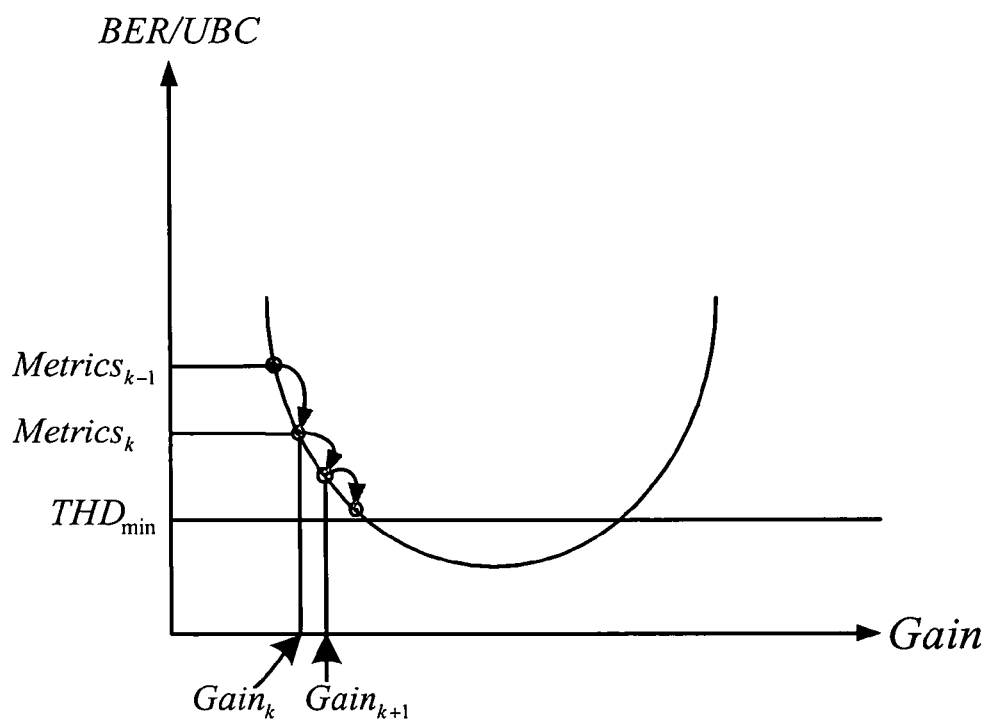
FIG. 5 is a schematic graph of the content of maximum gain register set by a controller at the ACI acquisition mode according to the invention.

FIG. 5 is a schematic graph of the content of the maximum gain register 331 set by the controller 340 at the ACI acquisition mode according to the invention. The controller 340 at the ACI Acquisition mode adjusts the gain of the modules 311, 316 by setting the content of the register 331 based on an equation as follows:

$$\text{Gain}_{k+1} = \text{Gain}_k - \mu_1,$$

where $\mu_1$ indicates a first step size, $\text{Gain}_{k+1}$ indicates a next content of the maximum gain register 331 to be set by the controller 340, and $\text{Gain}_k$ indicates a content of the maximum gain register 331 currently set by the controller 340. The first step size $\mu_1$ can be represented as:

$$\mu_1 = \mu \times f(\text{Metrics}_k, \text{Metrics}_{k-1}),$$

where $\mu$ is a constant, $\text{Metrics}_k$ indicates a current index, $\text{Metrics}_{k-1}$ indicates a previous index, and f(a,b) indicates a function as follows:

$$f(a,b) = \begin{cases} 1, & a \text{ or } b > THD_{min} \\ a-b, & \text{otherwise,} \end{cases}$$

for $THD_{min}$ indicates a first threshold. The current index $\text{Metrics}_k$ and the previous index $\text{Metrics}_{k-1}$ are the BERs or UBCs produced by the FEC decoder and frame synchronizer device 360, or the SNRs produced by the baseband processor 350.

Figure 6:
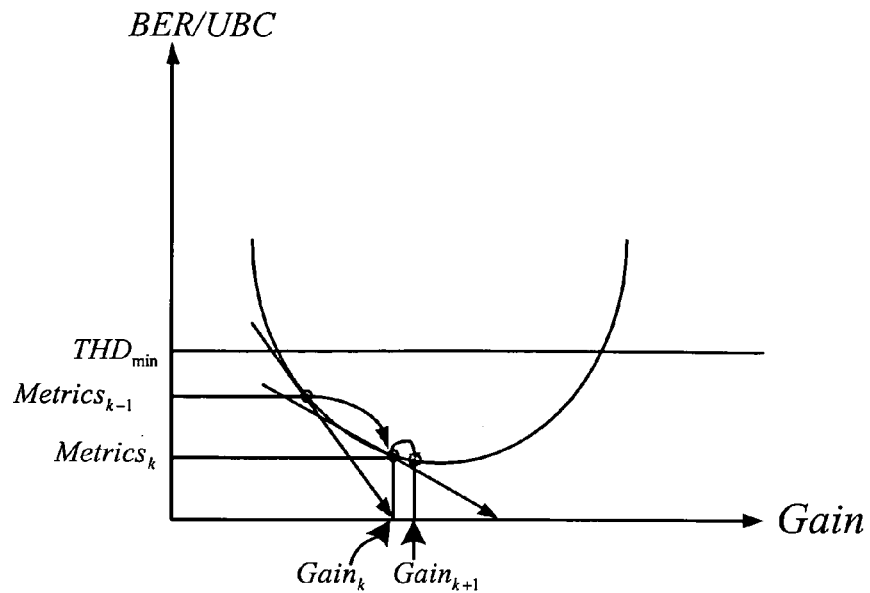
FIG. 6 is a schematic graph of the content of maximum gain register set by a controller at the ACI tracking mode according to the invention.

FIG. 6 is a schematic graph of the content of the maximum gain register 331 set by the controller 340 at the ACI tracking mode according to the invention. The controller 340 at the ACI Tracking mode adjusts the gain of the modules 311, 316 by setting the content of the register 331 based on an equation as follows:

$$\text{Gain}_{k+1} = \text{Gain}_k - \mu_2,$$

where $\mu_2$ indicates a second step size, $\text{Gain}_{k+1}$ indicates the next content of the maximum gain register 331 to be set by the controller 340, and $\text{Gain}_k$ indicates the content of the maximum gain register 331 currently set by the controller 340. The first step size $\mu_1$ is greater than the second step size $\mu_2$. The second step size $\mu_2$ can be represented as:

$$\mu_2 = \mu \times g(\text{Metrics}_k, \text{Metrics}_{k-1}),$$

where $\mu$ is a constant, $\text{Metrics}_k$ indicates a current index, $\text{Metrics}_{k-1}$ indicates a previous index, and g(a,b) indicates a function as follows:

$$g(a,b) = \begin{cases} 1, & \text{if } a > THD_{min} \\ \frac{1}{A}\text{sign}(a-b) & \text{if } a > THD2 \\ \frac{1}{B}\text{sign}(a-b) & \text{otherwise,} \end{cases}$$

for $THD_{min}$ indicates the first threshold, THD2 indicates a second threshold, A, B are each a constant, the first threshold $THD_{min}$ is greater than the second threshold THD2, and B>A>1.

Figure 7:
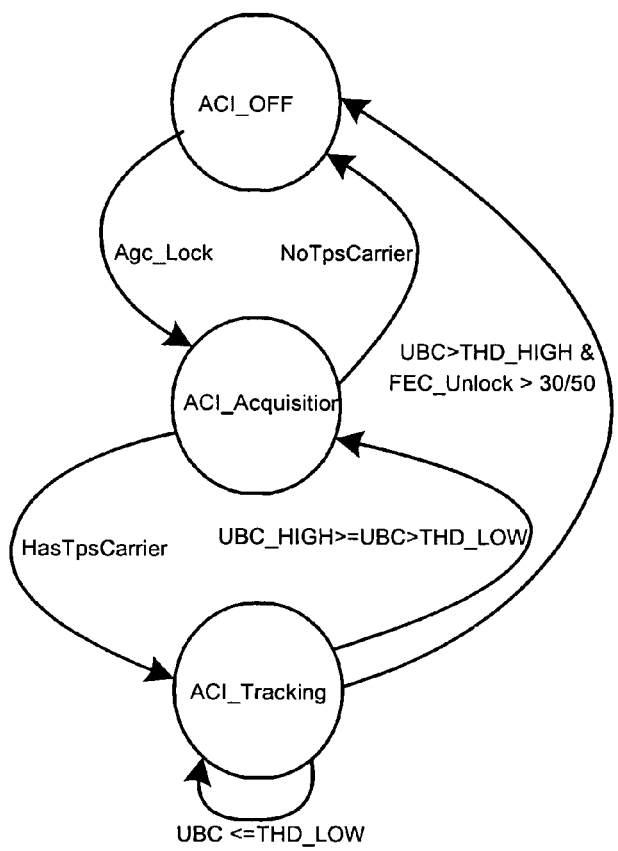
FIG. 7 is a state transition chart of a controller according to the invention.

FIG. 7 is a state transition chart of the controller 340 according to the invention. As shown in FIG. 7, the controller 340 is initialized to enter the ACI off mode ACI_Off. When the controller 340 receives the AGC lock signal AGC_Lock produced by the AGC device 330, it changes from the ACI off mode ACI_Off into the ACI acquisition mode ACI_Acquisition. When the controller 340 receives the transmit parameter signaling lock signal TPS_Lock produced by the baseband processor 350, it changes from the ACI acquisition mode ACI_Acquisition into the ACI tracking mode ACI_Tracking.

Figure 8:
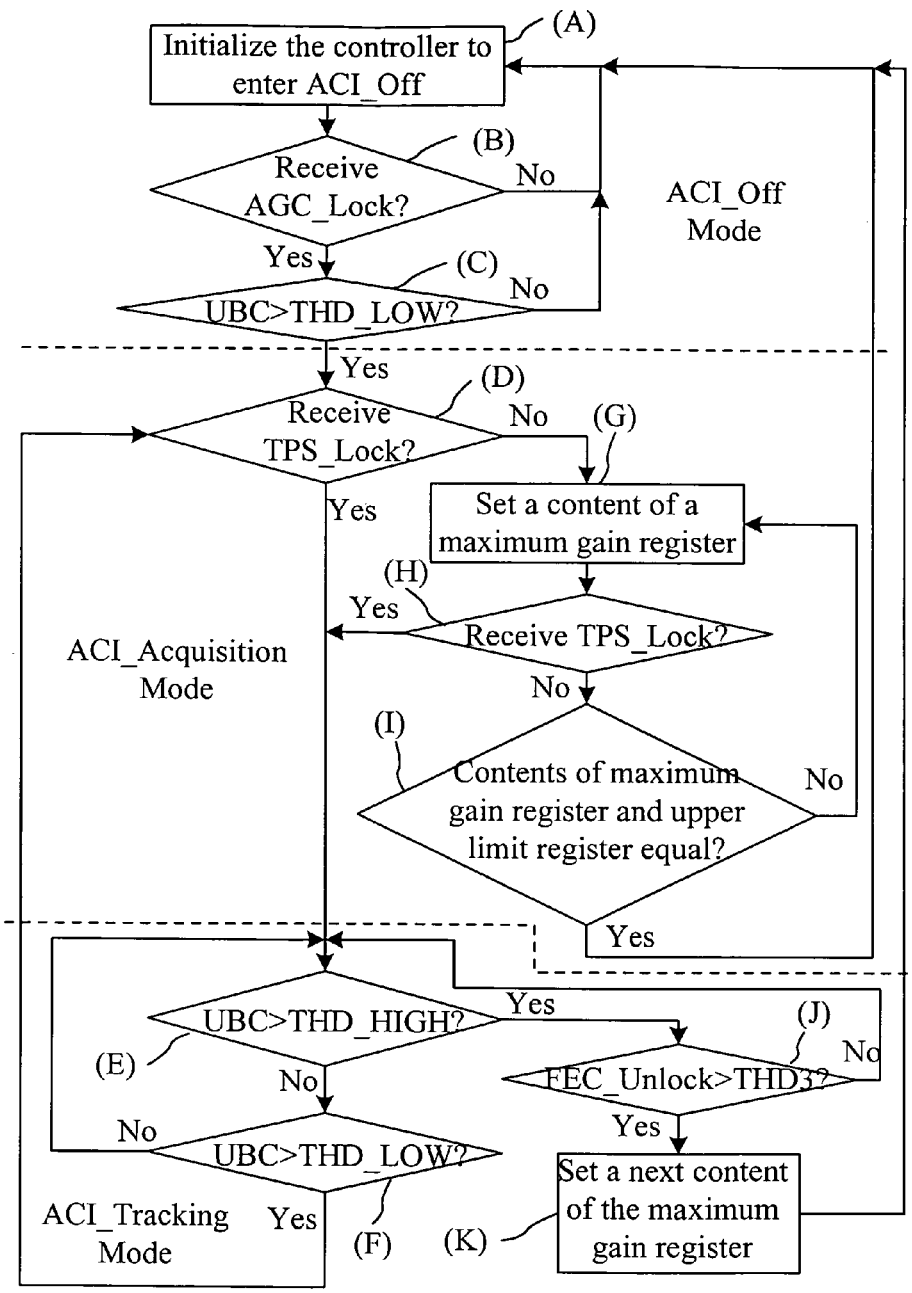
FIG. 8 is a flowchart of an AGC method applied in the wireless receiver system of FIG. 3 according to the invention.

FIG. 8 is a flowchart of the AGC method applied in the wireless receiver system. As cited, the wireless receiver system includes the receiving path 310 and the controller 340. The receiving path 310 has the plurality of modules, including the first module 311 and the last module 316. Each module has an adjustable gain. The first module 311 is coupled to the antenna system 370. The controller 340 sets the AGC device 330 to thereby adjust the gain of the modules 311, 316.

As shown in FIG. 8, in step (A), when an external reset signal is received, the controller 340 is initialized to enter an ACI off mode ACI_Off.

In step (B), the controller 340 determines whether an AGC lock signal AGC_Lock produced by the AGC device 330 is received.

In step (C), when it is determined that the signal AGC_Lock is received, the controller 340 further determines whether a UBC produced by the FEC decoder and frame synchronizer device 360 is greater than a first threshold THD_LOW.

In step (D), when it is determined that the UBC is greater than the first threshold THD_LOW, the controller 340 enters an ACI acquisition mode ACI_Acquisition and determines whether a transmit parameter signaling lock signal TPS_Lock produced by the baseband processor 350 is received.

In step (E), when it is determined that the signal TPS_Lock is received, the controller 340 enters an ACI tracking mode ACI_Tracking and determines whether the UBC is greater than a second threshold THD_HIGH.

In step (F), when it is determined that the UBC is not greater than the second threshold THD_HIGH, the controller 340 re-determines whether the UBC is greater than the first threshold THD_LOW. When it is determined that the UBC is not greater than the first threshold THD_LOW, the controller 340 stays at the mode ACI_Tracking, and the procedure returns to step (E).

The controller 340 at the mode ACI_Tracking adjusts the gain of the modules 311, 316 by setting the content of a maximum gain register 331 of the AGC device 330 based on an equation as follows:

$$\text{Gain}_{k+1} = \text{Gain}_k - \mu_2,$$

where $\mu_2$ indicates a second step size, $\text{Gain}_{k+1}$ indicates a next content of the maximum gain register 331 to be set by the controller 340, and $\text{Gain}_k$ indicates a content of the maximum gain register 331 currently set by the controller 340.

In step (F), when it is determined that the UBC is greater than the first threshold THD_LOW, the controller 340 re-enters the mode ACI_Acquisition. The controller 340 at the mode ACI_Acquisition adjusts the gain of the modules 311, 316 by setting the content of the register 331 based on an equation as follows:

$$\text{Gain}_{k+1} = \text{Gain}_k - \mu_1,$$

where $\mu_1$ indicates a first step size, $\text{Gain}_{k+1}$ indicates the next content of the maximum gain register 331 to be set by the controller 340, and $\text{Gain}_k$ indicates the content of the maximum gain register 331 currently set by the controller 340. The first step size $\mu_1$ is greater than the second step size $\mu_2$.

In step (G), when step (D) determines that the transmit parameter signaling lock signal TPS_Lock is not received, the controller 340 sets the content of the register 331 of the AGC device 330.

In step (H), the controller 340 determines whether the signal TPS_Lock is received.

When step (H) determines that the signal TPS_Lock is received, the controller 340 executes step (E).

In step (I), when step (H) determines that the signal TPS_Lock is not received, the controller 340 further determines whether the content of the register 331 is equal to the content of an upper limit register 333 of the AGC device 330.

When step (I) determines that the content of the register 331 is equal to the content of an upper limit register 333 of the AGC device 330, which indicates that the content of the register 331 is adjusted to the upper limit, the controller 340 executes step (A) for re-entering the mode ACI_Off.

When step (I) determines that the content of the register 331 is not equal to the content of an upper limit register 333 of the AGC device 330, the controller 340 executes step (G).

When step (E) determines that the UBC is greater than the second threshold THD_HIGH, the controller 340 further determines whether the number of FEC unlock signals (FEC_Unlock number) produced by the FEC decoder and frame synchronizer device 360 is greater than a third threshold THD3. When the FEC_Unlock number is not greater than the third threshold THD3, the controller 340 stays at the mode ACI_Tracking.

When step (J) determines that the FEC_Unlock number is greater than the third threshold THD3, the controller 340 sets the content of the register 331 to the maximum and enters the mode ACI_Off. The third threshold THD3 is preferably a value of 60.

When step (C) determines that the UBC is not greater than the first threshold, the controller 340 executes step (A). When step (B) determines that the signal AGC_Lock is not received, the controller 340 executes step (A).

FIG. 9 is a comparison of the invention and prior art performance, which respectively measures the carrier to interference energy ratio (C/I) within two carrier channels (N−2, N+2) adjacent to the main carrier and the sensitivity at the conditions of 64 QAM, code ratio CR=2/3 and Guard interval GI=1/4. As shown in FIG. 9, the invention has the C/I values identical to the prior art, but the sensitivity of the invention is considerably better than that of the prior art. Therefore, the invention can have the best efficiency to the ACI prevention compared with the prior art.

FIG. 10 is a schematic diagram showing the use of the AGC device 330 to adjust gains of the receiver path according to the invention. For obtaining a smaller noise exponent, when the gain is not enough, the AGC device 330 firstly increases the gain of the RF variable gain amplifier 312. If the gain is still not enough after the amplification, the AGC device 330 then increases the gain of the IF variable gain amplifier, and meanwhile, the gain of the RF amplifier 312 is remained at the maximum, as shown by the symbol RF max in FIG. 10. When an ACI occurs, the content of the register 331 is reduced to thereby reduce the setting RF max, i.e., the maximum gain of the RF amplifier 312. Accordingly, operating the RF amplifier 312 in the non-linear range is prevented, and the ACI effect is reduced.

In the summary, it is known that the setting RF max in the RF section and the received signal quality, such as the BER, of the system can have the curves as shown in FIG. 4, when the strength of the desired signal and the ACI signals are fixed. The invention applies a steepest decent method to different step sizes for adjusting the content of the register 331 to the best maximum gain. As cited, the invention uses an adaptive signal processing method to adjust the AGC device to thereby lower the ACI effect. For the best received signal quality, the different ACI strength can be appropriately adjusted.

Although the present invention has been explained in relation to its preferred embodiment, it is to be understood that many other possible modifications and variations can be made without departing from the spirit and scope of the invention as hereinafter claimed.

What is claimed is:

1. A wireless receiver system with automatic gain control, comprising:
a receiving path, having a first module and a last module from a plurality of modules, the first module being coupled to an antenna system, wherein each said module having an adjustable gain;
an analog to digital converter (ADC), coupled to the last module of the receiving path, for producing a digital signal;
an automatic gain control (AGC) device, coupled to the plurality of modules respectively and coupled an output of the ADC, for adjusting a gain of the modules and producing an AGC lock signal based on the digital signal; and
a controller, connected to the AGC device, for setting the AGC device based on an adjacent channel interference (ACI) off mode, an adjacent channel interference (ACI) acquisition mode and an adjacent channel interference tracking mode thereby accordingly adjusting the gain of the modules.

2. The system as claimed in claim 1, further comprising:
a baseband processor, coupled to the ADC and the controller, to produce a signal to noise ratio (SNR) and a transmit parameter signaling (TPS) lock signal based on the digital signal for providing the controller to accordingly operate transitions of the ACI off mode, the ACI acquisition mode and the ACI tracking mode, and to produce a baseband digital signal based on the digital signal.

3. The system as claimed in claim 2, further comprising:
a forward error correction (FEC) decoder and frame synchronizer device, coupled to the baseband processor and the controller, for producing a bit error rate (BER), an uncorrected block count (UBC) and a forward error correction unlock signal based on the baseband digital signal to accordingly provide the controller to operate the transitions of the ACI off mode, the ACI acquisition mode and the ACI tracking mode.

4. The system as claimed in claim 3, wherein according to the ACI off mode, the ACI acquisition mode and the ACI tracking mode, the controller respectively sets the maximum gain register of the AGC device to thereby adjust the gain of the modules.

5. The system as claimed in claim 4, wherein the AGC device has a maximum gain register and an upper limit register, and the maximum gain register temporarily stores a maximum of the gain of the modules, the upper limit register temporarily stores an upper limit of the gain of the modules, and a content of the maximum gain register is smaller than or equal to a content of the upper limit register.

6. The system as claimed in claim 5, wherein the controller at the ACI off mode adjusts the gain of the modules by setting the contents of the maximum gain register and the upper limit register equal.

7. The system as claimed in claim 5, wherein the controller at the ACI acquisition mode adjusts the gain of the modules by setting the maximum gain register based on an equation as follows:

$$Gain_{k+1} = Gain_k - \mu_1,$$

where $\mu_1$ indicates a first step size, $Gain_{k+1}$ indicates a next content of the maximum gain register to be set by the controller, and $Gain_k$ indicates a content of the maximum gain register currently set by the controller; and the controller at the ACI tracking mode adjusts the gain of the modules by setting the maximum gain register based on an equation as follows:

$$Gain_{k+1}=Gain_k-\mu_2,$$

where $\mu_2$ indicates a second step size, $Gain_{k+1}$ indicates the next content of the maximum gain register to be set by the controller, $Gain_k$ indicates the content of the maximum gain register currently set by the controller, and the first step size $\mu_1$ is greater than the second step size $\mu_2$.

8. The system as claimed in claim 7, wherein the first step size $\mu_1$ is represented as:

$$\mu_1=\mu \times f(Metrics_k, Metrics_{k-1}),$$

where $\mu$ is a constant, $Metrics_k$ indicates a current index, $Metrics_{k-1}$ indicates a previous index, and f(a,b) indicates a function as follows:

$$f(a,b) = \begin{cases} 1, & a \text{ or } b > THD_{min} \\ a-b, & \text{otehrwise}, \end{cases}$$

for $THD_{min}$ indicates a first threshold; and the second step size $\mu_2$ is represented as:

$$\mu_2=\mu \times g(Metrics_k, Metrics_{k-1}),$$

where g(a,b) indicates a function as follows:

$$g(a,b) = \begin{cases} 1, & \text{if } a > THD_{min} \\ \frac{1}{A}\text{sign}(a-b) & \text{if } a > THD2 \\ \frac{1}{B}\text{sign}(a-b) & \text{otherwise}, \end{cases}$$

for THD2 indicates a second threshold, the first threshold is greater than the second threshold, A, B are each a constant, and B>A>1.

9. The system as claimed in claim 8, wherein the current index and the previous index are the BER produced by the FEC decoder and frame synchronizer device, the current index and the previous index are the UBC produced by the FEC decoder and frame synchronizer device, or the current index and the previous index are the SNR produced by the baseband processor.

10. The system as claimed in claim 2, wherein an initialization of the controller starts at the ACI off mode, and the controller at the ACI off mode is changed into the ACI acquisition mode when the AGC lock signal produced by the AGC device is received by the controller.

11. The system as claimed in claim 10, wherein the controller at the ACI acquisition mode is changed into the ACI tracking mode when the TPS lock signal produced by the baseband processor is received by the controller.

12. An automatic gain control (AGC) method applied in a wireless receiver system with a receiving path and a controller, the receiving path having a plurality of modules including a first module connected to an antenna system a last module, each said module having an adjustable gain, the controller controlling an AGC device to adjust a gain of the modules, the method comprising the steps of:
(A) initializing the controller at an adjacent channel interference (ACI) off mode;
(B) using the controller to determine whether an AGC lock signal produced by the AGC device is received;
(C) using the controller to determine whether an uncorrected block count (UBC) produced by a forward error correction decoder and frame synchronizer device is greater than a first threshold when the AGC lock signal is received;
(D) determining whether a transmit parameter signaling (TPS) lock signal produced by a baseband processor is received after the controller enters at an ACI acquisition mode when the UBC is greater than the first threshold;
(E) determining whether the UBC is greater than a second threshold after the controller enters at an ACI tracking mode when the transmit parameter signaling lock signal is received; and
(F) using the controller to re-determine whether the UBC is greater than the first threshold when the UBC is not greater than the second threshold, and making the controller stay at the ACI tracking mode when re-determining that the UBC is not greater than the first threshold;
wherein the controller at the ACI tracking mode adjusts the gain of the modules by setting a maximum gain register of the AGC based on an equation as follows:

$$Gain_{k+1}=Gain_k-\mu_2,$$

where $\mu_2$ indicates a step size, $Gain_{k+1}$ indicates a next content of the maximum gain register to be set by the controller, and $Gain_k$ indicates a content of the maximum gain register currently set by the controller.

13. The method as claimed in claim 12, wherein the controller is changed into the ACI acquisition mode when the UBC greater than the first threshold is determined in step (F);
wherein the controller at the ACI acquisition mode adjusts the gain of the modules by setting the maximum gain register based on an equation as follows:

$$Gain_{k+1}=Gain_k-\mu_1,$$

where $\mu_1$ indicates a first step size, and the first step size is greater than the second step size.

14. The method as claimed in claim 13, further comprising the steps of:
(G) using the controller to set a content of a maximum gain register of the AGC device when step (D) determines that the TPS lock signal is not received; and
(H) using the controller to re-determine whether the TPS lock signal is received and to execute step (E) when the TPS lock signal received is re-determined.

15. The method as claimed in claim 14, further comprising:
(I) using the controller to determine whether the content of the maximum gain register equals to a content of an upper limit register of the AGC device when step (H) determines that the TPS lock signal is not received, and executing step (A) by the controller when the content of the maximum gain register equals to the content of the upper limit register of the AGC device, otherwise, executing step (G).

16. The method as claimed in claim 15, further comprising:
(J) making the controller stay at the ACI tracking mode when the UBC in step (E) is greater than the second threshold and further that the number of forward error correction unlock signals produced by the FEC decoder and frame synchronizer device is not greater than a third threshold is determined.

17. The method as claimed in claim 16, further comprising:
(K) using the controller to set the content of the maximum gain register to the maximum when step (J) determines that the number of forward error correction unlock signals is greater than the third threshold, and entering the controller at the ACI off mode.

18. The method as claimed in claim 17, wherein the controller executes step (A) when step (C) determines that the UBC is not greater than the first threshold.

19. The method as claimed in claim 18, wherein the controller executes step (A) when step (B) determines that the AGC lock signal is not received.

20. The method as claimed in claim 19, wherein the first step size $\mu_1$ is represented as:

$$\mu_1 = \mu \times f(\text{Metrics}_k, \text{Metrics}_{k-1}),$$

where $\mu$ is a constant, $\text{Metrics}_k$ indicates a current index, $\text{Metrics}_{k-1}$ indicates a previous index, and f(a,b) indicates a function as follows:

$$f(a, b) = \begin{cases} 1, & a \text{ or } b > THD_{min} \\ a - b, & \text{otehrwise}, \end{cases}$$

for $THD_{min}$ indicates a first threshold; and the second step size $\mu_2$ is represented as:

$$\mu_2 = \mu \times g(\text{Metrics}_k, \text{Metrics}_{k-1}),$$

where g(a,b) indicates a function as follows:

$$g(a, b) = \begin{cases} 1, & \text{if } a > THD_{min} \\ \frac{1}{A}\text{sign}(a - b) & \text{if } a > THD2 \\ \frac{1}{B}\text{sign}(a - b) & \text{otherwise}, \end{cases}$$

for THD2 indicates a second threshold, the first threshold is greater than the second threshold, A, B are each a constant, and B>A>1.

* * * * *